United States Patent [19]

Morgan et al.

[11] Patent Number: 5,075,037
[45] Date of Patent: Dec. 24, 1991

[54] SELECTIVE CATALYTIC ACTIVATION OF POLYMERIC FILMS

[75] Inventors: Albert W. Morgan, Wilbraham; James P. Brozek, Chicopee, both of Mass.; James D. Capistran, Suffield, Conn.; Michael T. O'Connor, Jr., Springfield, Mass.

[73] Assignee: Monsanto Company, St. Louis, Mo.

[21] Appl. No.: 468,509

[22] Filed: Jan. 22, 1990

Related U.S. Application Data

[60] Division of Ser. No. 320,914, Mar. 7, 1989, Pat. No. 4,910,072, and a continuation of Ser. No. 928,499, Nov. 7, 1986, abandoned.

[51] Int. Cl.$^5$ .................................... H01L 13/00
[52] U.S. Cl. .................. 252/513; 252/501.1; 252/512; 252/514; 264/104; 156/242; 156/244.17; 427/96; 430/311
[58] Field of Search ............ 252/501.1, 512, 514; 264/104; 156/242, 244.17; 427/96; 430/311

[56] References Cited

U.S. PATENT DOCUMENTS

| | | | |
|---|---|---|---|
| 3,347,724 | 10/1967 | Schneble et al. | 117/47 A |
| 3,370,974 | 2/1968 | Hepfer | 117/47 |
| 3,414,427 | 12/1968 | Levy | 117/47 |
| 3,423,226 | 4/1969 | Jensen | 117/47 |
| 3,437,507 | 4/1969 | Jensen | 117/47 |
| 3,488,166 | 1/1970 | Kovac et al. | 29/195 |
| 3,507,681 | 4/1970 | Cooper | 117/47 |
| 3,515,649 | 6/1970 | Hepfer | 204/38 |
| 3,520,723 | 7/1970 | Sterman | 117/236 |
| 3,523,824 | 8/1970 | Powers | 117/239 |
| 3,523,874 | 8/1970 | Day | 204/30 |
| 3,533,828 | 10/1970 | Rowe | 117/47 |
| 3,560,257 | 2/1971 | Schnebel et al. | 117/212 |
| 3,567,488 | 3/1971 | Rathsack | 117/47 |
| 3,567,489 | 3/1971 | Rathsack | 117/47 |
| 3,615,471 | 10/1971 | Lenoble et al. | 96/38.3 |
| 3,616,296 | 10/1971 | Bernhardt et al. | 204/30 |
| 3,639,153 | 2/1972 | Waggoner et al. | 117/118 |
| 3,642,476 | 2/1972 | Mseley | 96/38 |
| 3,656,952 | 4/1972 | Miller | 96/48 |
| 3,672,986 | 6/1972 | Schneble et al. | 117/212 |
| 3,684,572 | 8/1972 | Taylor | 117/47 |
| 3,701,675 | 10/1972 | Kallrath | 117/47 A |
| 3,702,286 | 11/1972 | Ichiki | 204/30 |
| 3,719,490 | 3/1973 | Yudelson | 96/48 PD |
| 3,772,056 | 11/1973 | Polichette | 117/47 A |
| 3,779,758 | 12/1973 | Polichette | 96/36.2 |
| 3,847,648 | 11/1974 | Vincent et al. | 117/47 A |
| 3,853,589 | 12/1974 | Andrews | 117/47 A |
| 3,900,320 | 8/1975 | Rolker et al. | 96/35.1 |
| 3,904,783 | 9/1975 | Nara et al. | 427/54 |
| 3,925,578 | 12/1975 | Polichette | 427/304 |
| 3,930,109 | 12/1975 | Brandet et al. | 428/422 |
| 3,937,857 | 2/1976 | Brummett | 427/98 |
| 3,942,983 | 3/1976 | DiBlas et al. | 96/48 PD |
| 3,959,547 | 5/1976 | Polichette | 428/209 |
| 3,963,841 | 6/1976 | Anschel et al. | 427/304 |
| 3,994,727 | 11/1976 | Polichette et al. | 96/38.4 |
| 4,006,047 | 2/1977 | Brummett et al. | 156/656 |
| 4,017,265 | 4/1977 | Taylor | 428/675 |
| 4,021,314 | 5/1977 | Dafter | 204/30 |
| 4,063,004 | 12/1977 | Quinn | 428/626 |
| 4,250,225 | 2/1981 | Shirahata et al. | 428/336 |
| 4,368,281 | 1/1983 | Brummett | 523/458 |
| 4,486,463 | 12/1984 | Rubner | 427/53.1 |
| 4,493,861 | 1/1985 | Sirinyan et al. | 437/304 |
| 4,560,643 | 12/1985 | Finter et al. | 430/346 |
| 4,574,095 | 3/1986 | Baum et al. | 427/53.1 |
| 4,645,573 | 2/1987 | Orban | 204/14.1 |
| 4,645,574 | 2/1987 | Orban | 204/14.1 |
| 4,910,072 | 3/1990 | Morgan et al. | 428/212 |

FOREIGN PATENT DOCUMENTS

1154152  6/1966  United Kingdom.

Primary Examiner—Patrick J. Ryan
Attorney, Agent, or Firm—Thomas E. Kelley; Richard H. Shear

[57] ABSTRACT

Catalytically inert films comprising complexes of polymer with a compound of a Group 1B or Group 8 metal at unusually low proportions of metal can be selectively activated, e.g. to provide a catalytic surface. Such films can be advantageously activatable to electroless deposition, e.g. of oxidation resistant layers of copper.

23 Claims, 3 Drawing Sheets

SELECTIVE CATALYTIC ACTIVATION OF POLYMERIC FILMS

This is a division of application Ser. No. 07/320,914, filed Mar. 7, 1989 now U.S. Pat. No. 4,910,072, and a continuation of Ser. No. 06/928,499, filed Nov. 7, 1986, abandoned.

Disclosed herein are inventions relating to polymeric films that can be activated to provide catalytic surfaces, e.g. to catalyze electroless deposition of metals, to precursors of such film, to methods of preparing and using such films, to the activated films and to articles coated with such films. Also disclosed are inventions relating to stable, e.g. oxidation resistant, coatings of electrolessly deposited metals such as copper and to methods of providing such coatings. More particularly disclosed are inventions relating to such films and methods based on polyvinyl chloride (PVC) that can be activated to provide catalytic surfaces, e.g. to electroless deposition, over selective areas of the film surface.

BACKGROUND OF THE INVENTION

Catalytic surfaces are provided on polymer substrates for a variety of purposes, including to provide initiation for electroless deposition of metal. Electroless deposition as used herein refers to the surface deposition from solution of a reduced metal coating onto a substrate by use of a chemical reducing agent without an outside source of electric current. Electroless deposition is used to deposit such metals as nickel, copper, gold, rhodium and palladium onto non-conductive substrates, e.g. polymeric substrates, to provide printed circuit boards, laser or magnetic data storage devices, catalytic devices, electromagnetic shielding of electronic equipment housings, conductive coatings, decorative coatings, antistatic coatings and the like.

Electroless deposition is generally catalyzed by reduced metal sites on the surface to be coated. Such deposition is often initially catalyzed by reduced palladium compounds distributed over the surface. Once initiated electroless deposition is autocatalytic in that deposited reduced metal provides an expanding catalytic surface for further deposition.

Considerable effort in the art of electroless deposition has been devoted to improving the quality of electrolessly-deposited metal coatings. U.S. Pat. No. 3,414,427 discloses that better adhesion of metal coatings is achieved by use of a more soluble complex, e.g. of palladium chloride, hydrogen chloride and water. Other developments based on modified palladium complexes are disclosed in U.S. Pat. Nos. 3,520,723 (cuprous iodide treatment), 3,847,648 (ketopalladium complexes), 3,937,857 and 4,006,047 (thermodecomposable palladium complexes) and 3,963,841 (dimethyl sulfoxide complexes).

Other attempts to improve metal coating adhesion have included etching of polymeric substrates, e.g. with chromic and/or sulfuric acid. See, for instance, U.S. Pat. Nos. 3,370,974; 3,423,226; 3,437,507; 3,507,681; 3,515,649; 3,616,296; and 3,702,286 which disclose various acid etching techniques which are often useful in preparing surfaces comprising ABS (a multiphase thermoplastic of dispersed butadiene with grafted styrene acrylonitrile copolymer).

Another method of improving adhesion is disclosed in U.S. Pat. No. 3,488,166 where reducible catalytic salts are bonded to formaldehyde resin substrates.

The following list of treatments further exemplify a wide variety of techniques disclosed in U.S. patents for improving the quality of electroless deposition: (a) substrates of aromatic polyamines are provided with hydroquinone radicals (U.S. Pat. No. 3,523,874), (b) polystyrene surfaces are treated with ethoxylates (U.S. Pat. No. 3,533,828), (c) substrates of carboxylic acid polymers are treated with ammonia or alkylenimines (U.S. Pat. Nos. 3,567,488 and 3,567,489, respectively), (d) PVC substrates are dehydrohalogenated and oxidized (U.S. Pat. No. 3,639,153), (e) polymeric surfaces are treated with quaternary amines (U.S. Pat. No. 3,684,572), (f) hydroxy functional filler is provided in polymer substrates (U.S. Pat. No. 3,701,675), (g) bipyridyls are incorporated into substrates (U.S. Pat. No. 3,853,589), (h) cyano-containing resins are incorporated into substrates (U.S. Pat. No. 4,017,265), (i) substrates are treated hydrosols of compounds having at least two oxygen atoms (U.S. Pat. No. 4,021,314); (j) substrates are pretreated with phosphorus compounds (U.S. Pat. No. 4,063,004), (k) substrates are subjected to glow discharge (U.S. Pat. No. 4,250,225), and (l) discrete crystalline/amorphous regions are developed in polyphenylene sulfide substrates (U.S. Pat. No. 4,486,463).

In still other cases, e.g. as disclosed in U.S. Pat. Nos. 3,347,724; 3,523,824 and 3,642,476, particles of reducible catalytic metal compounds have been adhered to a surface by incorporating such compounds into a binder, such as a thermoplastic resin. See also U.S. Pat. No. 3,560,257 where organic compounds of Group 1B and 8 metals are used with a variety of extenders (including polymers) to provide bonding between the substrate and the catalytic organic compound. See also U.S. Pat. No. 3,900,320 which discloses the use of thin polymer layers to provide a readily reducible catalytic metal salt on a substrate. Such layers are formed from polymer solutions where the weight ratio of polymer material to catalytic metal compound is required to be substantially less than about 15 to 1.

Because of the high cost of preferred catalytic metals, e.g. palladium, an objective has been to find ways to utilize lower levels of catalytic metal compound in combination with polymeric binders. In this regard, see U.S. Pat. No. 3,930,109 which discloses the application of thin films from dilute solutions or suspensions of polymeric binder and catalytic compounds; useful films are prepared from polymer solutions containing as little as 0.4 percent palladium chloride based on the weight of the polymer component. See also U.S. Pat. No. 4,493,861 which discloses the use of palladium complexes of (poly)butadiene from solutions with as low as 5.2 percent by weight of palladium (based on anhydrous polybutadiene). A disadvantage of such films is that the entire film surface is platable by electroless deposition. This means additional process steps are required when plating of less than the entire surface is desired, e.g. as in the production of printed circuitry, selective decoration or selective shielding.

In this regard selectivity in surface coating by electroless deposition has been provided in a variety of ways. For instance, U.S. Pat. No. 3,615,471 discloses methods of making optical masks by coating a transparent plate (e.g. glass) with a transparent photoresist layer comprising, for instance, polyvinyl alcohol and a chromate salt together with a plating catalyst. Such photoresist layer can be exposed to a light pattern and developed (e.g. solvent treated to remove the unexposed part of the layer) to leave a catalytic polymeric pattern which can be electrolessly coated.

Other methods involve the use of photosensitive materials, e.g. to promote reduction of the catalyst metal (see U.S. Pat. No. 3,772,056) or to otherwise generate catalytic nuclei (see U.S. Pat. Nos. 3,719,49; 3,779,785; 3,900,320; 3,925,578; 3,942,983; 3,959,547; 3,994,727; and 4,560,643.) See also U.S. Pat. No. 3,672,986 which discloses the production of printed circuitry by electrolessly depositing a metal coating over the entire surface of a board substrate. A patterned mask is applied to allow electroplating of the desired circuitry. The mask is removed to allow chemical etching of the undesired portions of the original electroless deposit. Other mask techniques are disclosed in U.S. Pat. No. 3,642,476. See also U.S. Pat. No. 3,656,952 which discloses films containing palladium salts and photosensitive compounds that allow electroless deposition of photographic images.

Other techniques for electroless deposition over selected surfaces, e.g. for printed circuitry, are disclosed in U.S. Pat. No. 4,368,281 where a precursor of the desired circuit is printed with a catalytic ink, e.g. a solution of resin, crosslinker, dye and high levels (5-15% by weight) of palladium complexes. See also U.S. Pat. No. 4,574,095 where vaporized palladium complexes are deposited as clusters on a laser-irradiated pattern of a polymer surface.

Since electroless deposition techniques generally involve a multitude of steps or somewhat sophisticated procedure which, as indicated above, may include pretreatments, etchings, washings, masking, catalyst reduction and the like, there is still a need for simple, effective electroless deposition technology which can utilize low levels of expensive catalyst compounds with minimal waste.

In addition to the above-mentioned difficulties attendant with electroless deposition processes it has been generally found that electrolessly deposited coatings of oxidation susceptible metals, e.g. copper, tend to rapidly discolor and lose their metallic appearance and properties. Prevention of such oxidation is generally achieved by applying a protective coating, for instance, of electrolessly deposited or electroplated nickel, electroplated copper, thermoplastic polymer or thermosetting resin.

OBJECTS OF THE INVENTION

An object of this invention is to provide polymeric films that can be activated to provide catalytic surfaces, e.g. to initiate electroless deposition of metals. Such films are desirably activatable by simple techniques, e.g. exposure to radiant energy. Such films should also be selectively activatable without the need to remove surfaces where electroless deposition is not desired or without the need for special photoreactive additives, such as photoactivatable crosslinkers or catalyst reducing agents.

Another object is to provide polymeric films that are readily adherently applied to a variety of substrates, e.g. filaments or rigid or flexible surfaces, and that are amenable to electroless deposition of metals without the difficulties of prior art practices such as etching, pretreatments and the like.

Still another object is to provide such polymeric films that are simple and of low cost requiring low levels of normally expensive catalytic compounds.

A further object of this invention is to provide substantially simplified methods of applying such selectively activatable surfaces to articles.

Yet another object is to provide substantially simplified methods of electrolessly depositing metal on selective areas of a uniformly coated substrate, e.g. extremely finely separated areas as required for microcircuitry and data storage devices.

One more object is to provide electrolessly deposited copper coatings having substantially improved oxidation resistance. Other objects of the invention include the provisions of methods for preparing and using such films in electroless deposition of metals. These and other objects of the invention will be more readily apparent in the following detailed description.

SUMMARY OF THE INVENTION

It has been discovered that the foregoing objectives can be realized with films that are activatable, e.g. to electroless deposition of copper, where such films comprise complexes of polymers and compounds of certain metals selected from Group 1B or Group 8 (CATALYTIC METAL). In many embodiments, such objectives can be more advantageously realized by using activatable films comprising PVC where the concentration of CATALYTIC METAL is lower at the surface of the film than in the interior of the film. In particular, it has been discovered that films consisting essentially of PVC and relatively low levels of palladium compounds can provide surfaces that are selectively activatable to electroless deposition by the application of radiant energy, e.g. light or heat. An especially desirable aspect of this invention is that polymeric surfaces can be provided that are inert to electroless deposition except in those areas that have been activated, e.g. by light or heat. A further especially advantageous and surprising aspect of this invention is that coatings of electrolessly deposited copper on such surfaces are exceptionally resistant to oxidation.

DETAILED DESCRIPTION OF THE INVENTION

Throughout the specification, percentages of compositions are by weight and temperatures are in degrees Celsius, unless indicated otherwise.

The term "complex" as used herein refers to organometallic combinations where there is molecular interaction, e.g. pi bonding, between polymers used in the films of this invention and solubilized CATALYTIC METAL compounds, for instance such that there is no substantial phase separation between the organic and metallic moieties during film formation.

As used in this specification and the appended claims, the term "substantially anhydrous" refers herein to materials useful in the various aspects of this invention that are essentially anhydrous or contain water in such low proportion that performance properties are not materially different than when materials are essentially anhydrous, e.g. there is no substantial reduction in the degree of electroless deposition of metal on a film of such materials.

The term "catalytically inert" refers herein to polymeric films with non-catalytic surfaces, e.g. surfaces onto which metal is not effectively deposited from standard electroless plating solutions such as disclosed in U.S. Pat. No. 3,329,512, incorporated herein by reference.

The term "activatable" refers herein to films of polymers complexed with CATALYTIC METAL that are substantially catalytically inert but which can be made catalytic, e.g. receptive to effective deposition of metal such as copper, nickel, cobalt and the like from standard electroless plating solutions, by activation, e.g. of the surface, of the film. Such activation can be effected by radiant energy, e.g. ultraviolet (UV) light, laser beam, X-rays, electron beams, etc., and/or by heating the surface, conductively or radiantly.

The term "activatably effective amount" refers herein to levels of components used in this invention, e.g. water, that permit activation of films of this invention to the effective electroless deposition of metals. An "activatably effective amount" is to be contrasted with an amount of such component that substantially reduces or inhibits the activation of the surface to electroless deposition. A particular aspect of this invention has been characterized in terms of activatably effective amounts of water, that is the amount of water that can be effectively tolerated in solutions or films of this invention.

The term "oxidation resistance" refers herein to electrolessly deposited layers of metals, in particular copper, that are substantially resistant to oxidation, as compared to electrolessly deposited metal coatings provided by prior art methods. In this regard, one aspect of this invention relates to electrolessly-deposited copper coatings that can be both thin, e.g. typically not more than about 1 micrometer thick, and surprisingly resistant to oxidation.

Polymers that can be useful in providing the complexes in the films of this invention include both saturated and unsaturated polymers. Unsaturated polymers, e.g. polybutadiene and polychloroprene, are often preferred where the unsaturated bonds provide advantageous sites for complexes with the CATALYTIC METAL compounds. Other unsaturated polymers including polyacetylene, polydiacetylene, allylic polymers, unsaturated rubbers such as polyisoprene and natural rubbers, certain ethylenepropylene diene monomer rubbers, and copolymers of unsaturated polymers such as ABS, styrene butadiene rubbers and the like can also be employed provided they form complexes with the CATALYTIC METAL compound to form activatable films.

In other preferred embodiments the polymer is saturated and halogenated, e.g. polyvinyl halides. Especially preferred is polyvinyl chloride which is believed, at least in some cases, to undergo dehydrohalogenation to form a complex with the CATALYTIC METAL compound.

Also expected to be useful in certain embodiments of this invention are other vinyl polymers such as polyvinyl alcohol, polyvinyl pyrrolidone, polyvinyl acetate, polyvinyl fluoride, polyvinylidene chloride and the like; halogenated polyolefins such as chlorinated polyethylene; polyarylsulfones, polyphenylene ethers, polysulfides such as polyphenylene sulfides; and copolymers and graft copolymers of such saturated and unsaturated polymers.

CATALYTIC METALS that have been found to be useful in combination with PVC to provide catalytically active sites for initiation of electroless deposition include gold, platinum, iridium, palladium, rhodium, and ruthenium. It is believed that osmium, which has not been evaluated because of its hazardous nature, and silver would also be useful for initiation of electroless deposition. The other Group 8 and Group 1B metals, i.e. iron, cobalt, nickel and copper, have not been shown to be useful in the films of this invention to initiate electroless deposition of copper onto activated films.

In many cases preferred CATALYTIC METALS are palladium and platinum. Of the two palladium is most often preferred. CATALYTIC METALS can be provided with a variety of convenient ligands that have been demonstrated as useful by practitioners in the art. Particularly useful palladium compounds include those where the ligands are nitrates, chlorides, nitriles such as acetonitrile, allylics or mixtures of such ligands or mixtures of compounds having such ligands. An often convenient criterion in selecting the compounds useful in this invention is solubility in the solvents used to provide precursor solutions for films. In this regard because palladium compounds are often of low solubility, it can be useful to enhance their solubility by providing a supplemental source of solubilizing ions such as chloride ions. Such chloride ions can be provided from among the more soluble chloride salts such as lithium chloride or from hydrogen chloride, e.g. either gaseous or as muriatic acid (provided allowance for water content is made as described below).

It has been found that the surface of films are advantageously activatable when the polymer and CATALYTIC METAL compound are provided at a specific molar ratio based on the number of monomer units to the number of atoms of the CATALYTIC METAL (MONOMER/METAL RATIO). More particularly, it has been surprisingly found that PVC films having a MONOMER/METAL RATIO of at least about 30 to 1 (and in some cases at least about 20 to 1) can be activatable. For instance, in most cases where PVC is complexed with palladium compounds, films are activatable when the MONOMER/METAL RATIO is not less than about 30 to 1. In some cases, e.g. when such films are formed in low humidity environments, the films are activatable when the MONOMER/METAL RATIO is as low as about 20 to 1, e.g. greater than about 15 to 1. That is, where certain films of PVC complexed with palladium compounds are formed in low humidity environments and the MONOMER/METAL RATIO is less than about 20 to 1, e.g. about 15 to 1, the films are not catalytically inert but rather will, without surface activation, readily acquire a metal coating when placed in electroless plating solution. Where the polymer is polybutadiene and the metal is palladium, films are activatable when the MONOMER/METAL RATIO is at least about 35 to 1.

More surprisingly, it has been found that such films are selectively activatable. That is, selected portions of the surface of the film can be made activatable while other portions of the film can be advantageously maintained in a catalytically inert condition. Such selective activation, e.g. to electroless deposition, is advantageously provided by a number of methods that will be readily apparent to those skilled in the art such as by exposing selected areas of the surface to ultraviolet light through a patterned mask.

As stated above, the concentration of CATALYTIC METAL compound is desirably low such that non-activated films are catalytically inert. Such concentrations are a characteristic of the portions of the film comprising a complex of polymer and CATALYTIC METAL compound. In this regard certain embodiments of this invention comprise films consisting essentially of such complex, e.g. of PVC and CATALYTIC METAL compound. In other embodiments films comprise portions of the complex in mixtures with other polymers or multiphase films, e.g. films comprising distinct phases of complex and phases of other polymers, or block copolymers of complex or even compatible blends of complex and other polymers. To afford uniform electroless deposition on such polymer films it is in many instances generally desired that the polymer phases comprising complex be substantially uniformly dispersed, at least over the surface of the film.

In many cases where the polymer is PVC, it is often preferably desired that the PVC-containing portions of the film contain lower levels of CATALYTIC METAL compound such that the MONOMER/METAL RATIO is at least about 60 to 1. To afford even more economical films it is in many cases desirable to use even lower levels of CATALYTIC METAL, e.g. such that the MONOMER/METAL RATIO is at least about 90 to 1 or even higher. For instance, it has been found that effective metal coatings, depending on the intended use of the plated article, can be achieved by electroless deposition onto PVC films where the MONOMER/METAL RATIO is even higher, e.g. as high as about 300 to 1 or even 700 to 1. In some instances suitable electroless deposition can be achieved at MONOMER/METAL RATIOS of several thousand to 1, e.g. as low as about 6000 to 1. Thus it has been surprisingly and advantageously found that polymeric films of this invention, e.g. consisting of PVC and palladium compounds, are selectively activatable, e.g. to electroless deposition, at extremely low levels of CATALYTIC METAL, thus affording an extremely economical use of CATALYTIC METAL.

While not intending to be bound thereby it is believed that the operability of this invention for PVC polymer is attributed to formation of pi-complexes of CATALYTIC METAL compounds with PVC. In this regard it is believed that at least certain CATALYTIC METALS can form pi-enyl complexes with PVC that has been dehydrohalogenated. Accordingly, another aspect of this invention is directed to films comprising pi-enyl complexes formed from PVC and a CATALYTIC METAL. It is further believed that such pi-enyl complexes have the ability to migrate along polymer chains so that uniformly dispersed complexes generated within a selective area of the polymeric film can migrate to form substantially uniformly distributed clusters of such pi-enyl complexes especially at the surface of the polymeric film. Such clusters which may comprise from about 3 to perhaps about 20 or more, e.g. up to about 150 or even 200, atoms of CATALYTIC METAL are believed readily amenable to reduction by reducing agents, such as formaldehyde, which are commonly found in electroless plating solutions. Reduced CATALYTIC METAL at such clusters is then available to catalytically initiate electroless deposition of metal.

Support for such possible migration of pi-enyl complexes is believed to be provided by surface analysis of films of PVC and palladium compounds according to one embodiment of this invention. Prior to activation such film surfaces exhibit negligible amounts of palladium metal, i.e. less than about 0.1 atom percent, while the concentration in the interior of the film contains as much as about 3 percent by weight of palladium. These films have been shown to be platably inert until surface activation whereupon the films become active to electroless deposition and exhibit substantially increased levels of CATALYTIC METAL at the surface. Accordingly, a further aspect of this invention comprises films having pi-enyl complexes formed from PVC and a CATALYTIC METAL where such films have an asymmetric distribution of such complex between the surface of the film and the bulk of the film.

Another aspect of this invention is film-forming solutions which can be utilized to provide catalytically activatable film. Such film-forming solutions can comprise polymer and a compound of a CATALYTIC METAL, both of which can provide a functional complex as described above. The solvent for such solutions is not considered critical to this invention and can comprise a number of organic solvents. Where the polymer is PVC, the solvent can comprise tetrahydrofuran (THF), methylene chloride, cyclohexanone, dimethyl acetamide, and the like, or a mixture of solvents for PVC with solvents for CATALYTIC METAL compounds. In this regard THF has been found to be a particularly useful solvent. Such film-forming solutions can comprise from about 1 to about 40 percent polymer. The level of polymer may be adjusted to film-forming conditions, for instance higher levels of polymer may provide higher solution viscosities that may be desirable in forming films on sloped or vertical surfaces from which thinner solutions may flow. It is expected that those skilled in the art will be able to readily adjust process variables such as the level of polymer, solution and/or film-forming temperatures, etc., to provide appropriate films on desired surfaces. While the level of polymer is not considered critical, it has been found, where the polymer is PVC, that activatable films are advantageously prepared from solutions comprising from about 5 to about 15 percent PVC. What is critical to the solutions of this invention is the relative proportion of polymer to CATALYTIC METAL. Such proportion is conveniently stated in terms of the above-described MONOMER/METAL RATIO. The film-forming solutions of the invention can be cast onto substrate as thin films from which the solvent is evaporated into an environment to provide a residual film of PVC and CATALYTIC METAL compound.

In one aspect of this invention, films are substantially anhydrous being formed from substantially anhydrous film-forming solutions in a substantially anhydrous environment.

In another aspect of this invention, films comprise an activatably effective amount of water. For instance where the polymer is PVC, it has been found that the presence of certain amounts of water in the precursor film-forming solutions adversely affect the ability of the resulting films to be activatable, e.g. to electroless deposition. It has also been found that the presence of certain amounts of water in the environment in which films are prepared can also adversely affect the ability of certain films to be activatable, e.g. to electroless deposition. In this regard reference is made to FIGS. 1 and 2 which illustrate such effects of water in films comprising PVC and palladium, where such utility is characterized in terms of "percent plating" which indicates the portion of a film surface area that became coated with a metal in an electroless plating solution. The water-based variables are "bulk water concentration" which is the percentage of water in the solvent of the film-forming solution and "relative humidity" of the environment into which solvent is evaporated from a casting of film-forming solution. The film-forming solution comprised about 10 percent PVC and palladium at a MONOMER/METAL RATIO of about 60 to 1; the organic solvent was THF. Other details are presented in Example 10 below.

Figure 1:
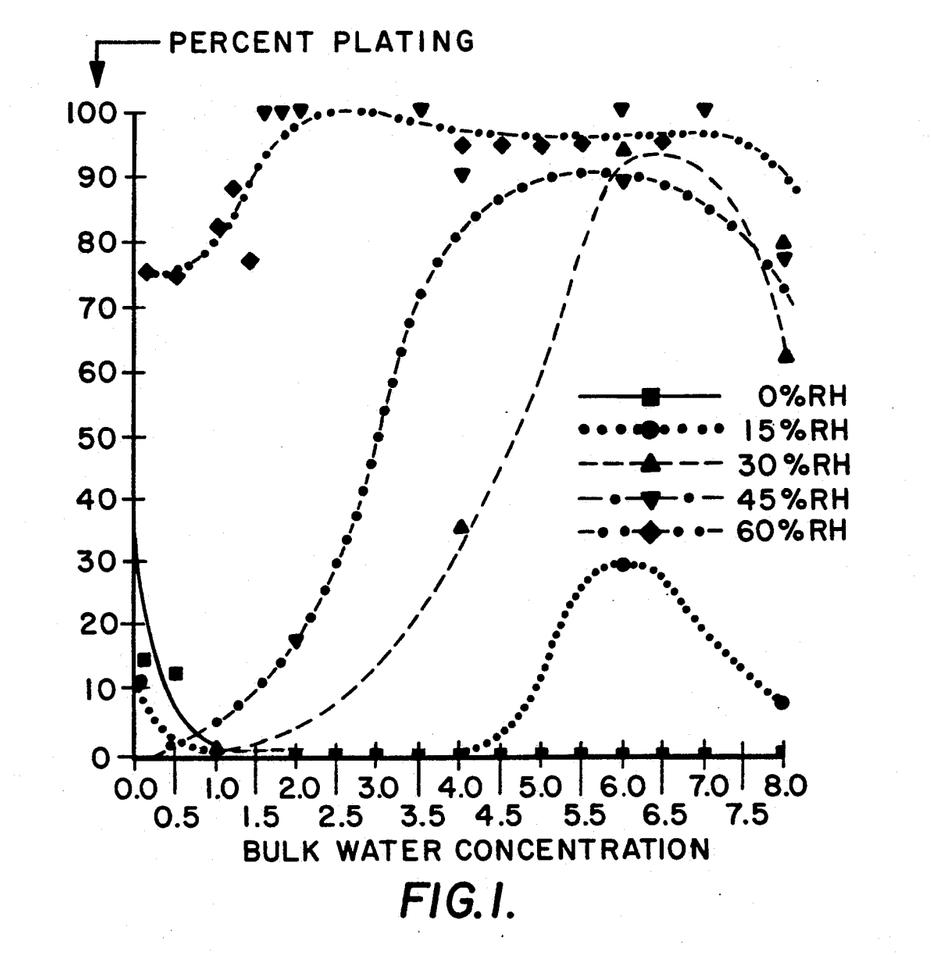
FIGS. 1 and 2 illustrate the effect of water on certain aspects of the invention.
Figure 2:
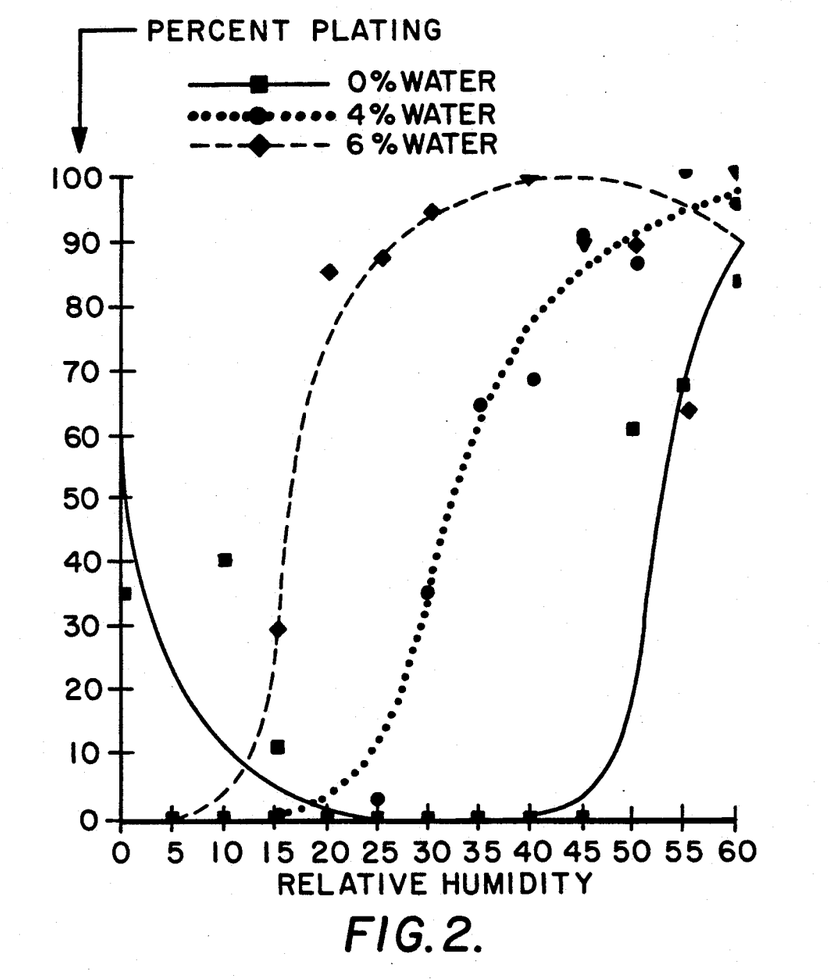

What FIG. 1 illustrates is that water can be tolerated in certain film-forming solutions provided the solution is formed into a film in an environment having a sufficiently high level of water, as indicated by relative humidity. Also illustrated is that platable films can be formed in environments having a wider range relative humidity from solutions where the solvent contains higher levels of water, e.g. about 5-8 percent, than where the solvent contains lower amounts of water, e.g. about 0-2 percent. This latter effect is also illustrated in FIG. 2. These figures illustrate more preferred aspects of this invention for films based on PVC and palladium. For instance, where it is difficult to eliminate ubiquitous water from film-forming solutions or from the environment in which films are formed, it is often desirable that, when the film-forming solution comprises THF solvent, the solvent comprises about 6 percent water, especially when it is difficult to control the relative humidity of the film-forming environment. In other cases, especially where it is difficult to control the amount of water in the solvent, it is often desirable to prepare the films of this invention in an environment where the relative humidity is at least about 20 percent, more preferably at least about 30 percent or higher. An upper level of relative humidity is believed to be about 80 percent. In this regard it has been found that films formed in an environment of about 85 percent relative humidity have exhibited no selectivity toward activation. That is, such films were readily covered with a metal coating when deposited in an electroless plating solution without activation.

PREPARATION OF FILM-FORMING SOLUTIONS

Solutions for forming activatable films can be provided by methods similar to those described below where the polymer is PVC. Solutions of PVC and CATALYTIC METAL can be prepared by dissolving PVC and CATALYTIC METAL compound in a common solvent. Generally such solutions have been conveniently prepared by adding prepared solutions of the CATALYTIC METAL to prepared solutions of PVC. It is often convenient, but not necessary that both prepared solutions comprise the same solvent, e.g. THF. In other cases, it may be preferable to dissolve the CATALYTICAL METAL compound (many of which are of low solubility) in another solvent.

With palladium compounds, other useful solvents include acetone, methyl ethyl ketone, methanol, methyl acetate and ethyl acetate. It is expected that other solvents, including mixtures, can be readily determined by routine experimentation. In some cases, e.g. with compounds of low solubility, it may be useful to add soluble anions to the solvents to assist in dissolution. For instance, with palladium compounds, e.g. $Pd(NO_3)_2$ or $PdCl_2(CH_3CN)_2$, it has proven useful to add soluble chloride salts, e.g. lithium chloride (LiCl), or acidic chloride, e.g. muriatic acid, to facilitate solubility. In other cases, where anhydrous solutions are not required, water can be used to facilitate solution or even be a major solvent component for the CATALYTIC METAL compound. Although solvent temperatures have been kept low, e.g. generally about room temperature, higher temperature may be useful in expediting the solution of some compounds.

Useful solvents for PVC include THF, methylene chloride, and cyclohexanone. When water is desired in the film-forming solutions, it is, of course, advantageous to use a solvent which is miscible with water at least up to the desired concentration of water, e.g. up to about 8% in the solvent. Since PVC is a major film component, it is generally advantageous to prepare the PVC solutions in concentrations suitable for the intended use. Generally such solutions will be at least about 1% PVC and no higher than about 40% PVC. A convenient concentration will generally be between about 5% and about 20%. When PVC is dissolved in THF, solutions between about 7% and 15% PVC (e.g. about 10% PVC) often have useful properties, e.g. in terms of viscosity, adhesiveness to substrates and film-forming speed.

FORMING ACTIVATABLE FILMS

The film-forming solutions can be used to provide activatable films in a variety of ways. As indicated in the following examples self-supporting films can be formed by casting the film-forming solutions on non-adhesive supports. When sufficient solvent has been removed from the solutions, a self-supporting film can be removed from the support. Depending on the film-forming conditions, e.g. MONOMER/METAL RATIO, amount of water in the solution, relative humidity in the environment, etc., such films can be activatable on either or both surfaces.

Articles can be provided with an activatable surface by coating the article with a film-forming solution of appropriate viscosity to assist in maintaining the desired film thickness. Coating can be effected by spraying, dipping and other procedures practiced in the coatings industry. For instance, filaments can be conveniently run through a bath of film-forming solution and printed circuits can be provided by using the film-forming solutions of this invention as inks to print a precursor film to the desired circuitry. Alternatively, printed circuits can be provided by coating a substrate, e.g. flexible film or rigid laminate, with a film-forming solution to provide a film that can be selectively activated in those areas where circuitry is desired. More specifically, printed circuit board laminates can be advantageously provided with circuitry, e.g. of electrolessly deposited copper, by selectively exposing an activatable coating to focused light, followed by immersion in an electroless plating solution. Extremely fine circuitry can be provided by surface activation with a laser of controlled, narrow width.

With some substrates, e.g. ABS surfaces, extremely thin coatings can be achieved by providing a coating with a film-forming solution of PVC and palladium and mechanically delaminating the bulk of the solid film, leaving a residue, e.g. of PVC complexed with CATALYTIC METAL, that is activatable, e.g. to electroless deposition.

Another method of providing activatable surfaces on molded articles comprises applying a film-forming solution to a mold surface corresponding to the desired activatable surface. When the solution is solidified to form a film, the pre-coated mold can be used to form the article. For instance, thermoplastic material cast or injected into the mold will acquire a surface of the precoated film that can be selectively activated to electroless deposition. In some cases the molding temperatures or temperatures of molten thermoplastic material may be sufficient to activate the transferred surface. Such procedures are useful for providing activated surfaces on the inside surfaces of housings for electronic components, e.g. to provide metal coatings by electroless deposition for shielding against electromagnetic interference.

ACTIVATION OF FILMS

Activated films of this invention, including activated coatings, can be provided by applying energy to the activatable films. In the case of PVC complexes with palladium, irradiation, e.g. U.V. radiation, or heating can be useful methods of applying energy for activation. In other cases, e.g. with complexes of polybutadiene or polychloroprene, irradiation rather than heating has been shown to be a useful method of activation. The type of activation selected may depend on factors such as the polymer complex of the film, the topography of the film, the desired catalytic function and the desired selectivity of activation. For instance, it may be advantageous to heat filaments coated with an activatable film to provide a generally activated surface as a precursor to a metal coated filament. In the case of providing electroless deposition of metal on data storage devices, e.g. laser readable substrates or magnetic readable substrates, it is expected to be advantageous to selectively activate discrete areas with finely focused radiation.

The following disclosure is provided to illustrate specific embodiments and aspects of the invention but does not imply any limitation of the scope of the invention.

EXAMPLE 1

The purpose of this example is to illustrate embodiments of the following aspects of this invention: the preparation of a film-forming solution comprising PVC and a CATALYTIC METAL compound, the preparation of activatable films from such solution, and the effects of surface activation of such films.

10 g of PVC powder (Geon ® 121 by B. F. Goodrich), dried in an oven at 60° for 48 hours, was dissolved under an anhydrous nitrogen atmosphere in 90 grams of dry THF to provide a dry 10% PVC solution.

Palladium dichloride bisacetonitrile ($PdCl_2BAN$) was dried for 48 hours at room temperature under a reduced pressure of about 21 millitorr. LiCl was dried in an oven at 150° for 48 hours. Under an anhydrous nitrogen atmosphere 0.25 g of dry $PdCl_2BAN$ and 0.04 g LiCl were dissolved in 1.36 g dry THF to provide a 6% Pd solution (about 15% $PdCl_2BAN$).

An anhydrous film-forming solution was prepared by combining 0.5 g of the 15% solution of $PdCl_2BAN$ and 10 g of dry 10% PVC solution to provide a film-forming solution containing about 3% Pd and having a MONOMER/METAL RATIO of about 60 to 1.

The film-forming solution was cast and dried (e.g. solvent evaporated) into films of about 0.01 mm thickness on three glass slides under each of the following three conditions: (a) in a substantially anhydrous nitrogen atmosphere, (b) in a nitrogen atmosphere containing water at about 10% RH and (c) in a nitrogen atmosphere containing water at about 85% RH. One set of three films (comprising one film prepared under each of the three conditions) was not subjected to activation. A second similar set of three films was activated by exposure to heat in a 180° oven for 5 minutes. A third similar set of three films, was activated by exposure to U.V. light for about 2 hours (film held about 25 mm from a 254 nanometer wavelength mercury arc lamp receiving radiation about 7.5 milliwatts/square centimeter).

Each film was stripped from the glass and immersed for about 5 minutes in a copper electroless plating solution prepared from copper sulfate pentahydrate, Rochelle salt (i.e. potassium sodium tartrate), formalin (i.e. 37% formaldehyde), sodium hydroxide (50%), and ethylenediaminetetraacetic acid (EDTA) to provide a solution (Copper Bath) of the following analysis:

2.5 g/l copper
3 g/l formalin
6 g/l hydroxide ion
22 g/l EDTA
pH 11.5–12.5

The Copper Bath was maintained at about 38° and agitated by a magnetic stir bar.

The results of the plating are found in Table 1 where the plating on the glass side of the film is in parentheses. The following symbols qualitatively indicate the degree of film coverage by a copper coating:

0 (none)
=(very little)
−(little)
+(substantial)
++(total)

TABLE 1

| ELECTROLESS DEPOSITION OF COPPER ON PVC FILMS CATALYTIC METAL SALT: $PdCl_2BAN$ SOLVENT: DRY THF CHLORIDE SOURCE: LiCl | | | |
|---|---|---|---|
| | Film-Forming Environment | | |
| Activation | Anhydrous | 10% RH | 85% RH |
| None | 0 (0) | 0 (0) | = (0) |
| Heat | + (+) | ++ (+) | ++ (−) |
| U.V. | ++ (+) | ++ (0) | − (−) |

EXAMPLE 2

In the manner of Example 1, this example serves to illustrate similar aspects of this invention where the CATALYTIC METAL compound is palladium dichloride ($PdCl_2$). The procedures of Example 1 are repeatd except that 0.17 g of $PdCl_2$ is used to prepare the 6% Pd solution.

The results of the electroless deposition are found in Table 2.

TABLE 2

| ELECTROLESS DEPOSITION OF COPPER ON PVC FILMS CATALYTIC METAL SALT: $PdCl_2$ SOLVENT: DRY THF CHLORIDE SOURCE: LiCl | | | |
|---|---|---|---|
| | Film-Forming Environment | | |
| Activation | Anhydrous | 10% RH | 85% RH |
| None | 0 | 0 | = |
| Heat | + (+) | ++ (+) | ++ (−) |
| U.V. | ++ (+) | ++ (0) | −(−) |

EXAMPLE 3

In the manner of Example 1, this example serves to illustrate similar aspects of this invention except where the CATALYTIC METAL compound is palladium nitrate ($Pd(NO_3)_2$). The procedures of Example 1 are repeated except that 0.22 g of $Pd(NO_3)_2$ is used to prepare the 6% Pd solution. The results of the electroless deposition are found in Table 3.

TABLE 3

ELECTROLESS DEPOSITION OF COPPER ON PVC FILMS
CATALYTIC METAL SALT: $Pd(NO_3)_2$
SOLVENT: DRY THF
CHLORIDE SOURCE: LiCl

| Activation | Film-Forming Environment | | |
|---|---|---|---|
| | Anhydrous | 10% RH | 85% RH |
| None | 0 | 0 | = |
| Heat | 0 (+) | ++ (+) | ++ (−) |
| U.V. | = (0) | − (+) | 0 (0) |

EXAMPLE 4

In the manner of Examples 1, 2 and 3, this example serves to illustrate the distinct aspects of similar embodiments of this invention where muriatic acid is used instead of LiCl to assist in dissolution of the palladium compound. The procedures of Examples 1, 2 and 3 are repeated except that 0.09 g of 37% HCl is used in place of 0.04 g LiCl. The results are shown in Table 4.

EXAMPLE 5

In the manner of Examples 1, 2 and 3, this example serves to illustrate the distinct aspects of similar embodiments of this invention where an activatably effective amount of water is incorporated into the solvent. The procedures of Examples 1, 2 and 3 are repeated except that the solvent comprises 6% water in THF. The results are shown in Table 5.

TABLE 4

ELECTROLESS DEPOSITION OF COPPER ON PVC FILMS

| Activation | Film-Forming Environment | | |
|---|---|---|---|
| | Anhydrous | 10% RH | 85% RH |
| Catalytic Metal Salt: $PdCl_2BAN$ | | | |
| None | 0 | 0 | ++ |
| Heat | = (+) | 0 (+) | − (−) |
| U.V. | ++ (−) | ++ (−) | − (0) |
| Catalytic Metal Compound: $PdCl_2$ | | | |
| None | 0 | 0 | + |
| Heat | = (+) | 0 (−) | − (−) |
| U.V. | ++ (−) | ++ (−) | = (0) |
| Catalytic Metal Salt: $Pd(NO_3)_2$ | | | |
| None | 0 | 0 | + |
| Heat | ++ (0) | 0 (+) | ++ (−) |
| U.V. | ++ (−) | ++ (−) | − (=) |

TABLE 5

ELECTROLESS DEPOSITION OF COPPER ON PVC FILMS

| Activation | Film-Forming Environment | | |
|---|---|---|---|
| | Anhydrous | 10% RH | 85% RH |
| Catalytic Metal: $PdCl_2BAN$ | | | |
| None | 0 | 0 | = |
| Heat | ++ (+) | ++ (+) | = (−) |
| U.V. | ++ (0) | = (0) | − (−) |
| Catalytic Metal: $PdCl_2$ | | | |
| None | 0 | = | = |
| Heat | ++ (+) | ++ (+) | − (−) |
| U.V. | ++ (0) | = (0) | = (−) |
| Catalytic Metal: $Pd(NO_3)_2$ | | | |
| None | 0 | + | |
| Heat | 0 (+) | ++ (++) | |

TABLE 5-continued

ELECTROLESS DEPOSITION OF COPPER ON PVC FILMS

| Activation | Film-Forming Environment | | |
|---|---|---|---|
| | Anhydrous | 10% RH | 85% RH |
| U.V. | 0 (0) | = (0) | |

EXAMPLE 6

This example serves to illustrate that aspect of this invention where a film can be stripped from a substrate to provide a substantially thinner residual layer that is activatable.

The film-forming solution of Example 3 was cast onto a sheet of ABS in an anhydrous nitrogen environment. The bulk of the film based on PVC and $Pd(NO_3)_2$ was readily stripped from the ABS sheet. The ABS sheet was then irradiated by U.V. light for about 18 hours and immersed in a Copper Bath. A uniform copper coating was deposited on the surface of the ABS sheet from which the film had been stripped.

EXAMPLE 7

This example serves to illustrate that gold, a Group 1B metal, is useful in embodiments of this invention. A film-forming solution was prepared essentially as in Example 1 except that $HAuCl_4.nH_2O$ was used as the CATALYTIC METAL compound to provide a solution having a MONOMER/METAL ratio of about 20:1. Films were prepared on glass slides in a nitrogen environment at 64% RH. Films were either (a) not activated, (b) activated by heat (180° for 5 minutes) or (c) activated by light (U.V. exposure for 24 hours) prior to immersion in a Copper Bath for 3 minutes. A copper coating was deposited only on the activated films.

EXAMPLE 8

This example serves to illustrate that ruthenium, rhodium, iridium and platinum (Group 8 metals) are useful in embodiments of this invention. Film-forming solutions were prepared essentially as in Example 1 using each of the following as CATALYTIC METAL compounds: $PtCl_2(CH_3CN)_2$, $RhCl_3.nH_2O$, $H_2PtCl_6.nH_2O$, $RuCl_3.nH_2O$, $H_2IrCl_6.nH_2O$, $IrCl_3.nH_2O$, and $PdCl_2BAN$ where the MONOMER/METAL ratio was about 20:1.

Films were prepared on glass slides under a nitrogen environment at 64% RH. Without further activation the films based on $H_2PtCl_6.nH_2O$ and $PdCl_2(CH_2CN)_2$ were active to electroless deposition from a Copper Bath. The other films, even when activated by heat (180° for 5 minutes) or light (U.V. for 24 hours) did not become copper coated to any visible extent.

Additional films were prepared on glass slides under a nitrogen environment at about 3% RH. After activation by light (U.V. for 24 hours) both platinum-based films exhibited some copper coating after immersion in a Copper Bath. After activation by heat (180° for 5 minutes) and immersion in a Copper Bath, a metal coating was visible on the rhodium, platinum, ruthenium, iridium and palladium based films.

EXAMPLE 9

This example serves to illustrate the concept of an activatably effective amount of water in embodiments of this invention.

Film-forming solutions were prepared essentially as in Example 1 except that water was added to individual volumes of the solution to provide the solutions indicated in Table 6 where water concentration is based on the weight of THF solvent and water.

Films were cast onto glass slides using film-forming solutions in nitrogen film-forming environments having water ranging from 0–60% RH as indicated in Table 6. The films were activated by heat (180° for 5 minutes) and then immersed in a Copper Bath. The effects of water content in the solvent and in the film-forming environment were quantified by projecting photographic slides of each film onto graph paper. The percent plating, determined by the ratio of the projected area having a copper coating to the projected area of the entire PVC film, is indicated in Table 6.

Portions of the results are also graphically presented in FIGS. 1 and 2.

TABLE 6

COPPER COATING OF PVC FILMS
PERCENT OF FILM AREA COATED

| Solvent % H$_2$O | Film-Forming Environment, % RH in Nitrogen | | | | | | | | | | | | |
|---|---|---|---|---|---|---|---|---|---|---|---|---|---|
| | 0 | 0 | 5 | 10 | 15 | 20 | 25 | 30 | 35 | 40 | 45 | 50 | 55 | 60 |
| 0 | 35 | 0 | 40 | 11 | 0 | 0 | 0 | 0 | 0 | 0 | 60 | 67 | 83 |
| 0.1 | 14 | — | 2.6 | — | — | — | — | — | — | — | — | — | 75 |
| 0.5 | 12 | — | — | — | — | — | — | — | — | — | — | — | 75 |
| 1 | 0 | 0 | 3.2 | 0 | 0 | 0 | 0 | 0 | 0 | 0 | 60 | 76 | 82 |
| 1.2 | 0 | — | 15 | — | — | — | — | — | — | — | — | — | 88 |
| 1.4 | 0 | — | 0 | — | — | — | — | — | — | — | — | — | 77 |
| 1.6 | 0 | — | 0 | — | — | — | — | — | — | — | — | — | 100 |
| 1.8 | 0 | — | 0 | — | — | — | — | — | — | — | — | — | 100 |
| 2.0 | 0 | 0 | 2.1 | 0 | 0 | 0 | 0 | 0 | 31 | 17 | 29 | 70 | 100 |
| 2.5 | 0 | — | 0 | — | — | — | — | — | — | — | — | — | 100 |
| 3.0 | 0 | — | 0 | — | — | — | — | — | — | — | — | — | 100 |
| 3.5 | 0 | — | 0 | — | — | — | — | — | — | — | — | — | 100 |
| 4.0 | 0 | 0 | 0 | 0 | 0 | 2.5 | 35 | 64 | 68 | 90 | 87 | 100 | 95 |
| 4.5 | 0 | — | 0 | — | — | — | — | — | — | — | — | — | 95 |
| 5.0 | 0 | — | 0 | — | — | — | — | — | — | — | — | — | 95 |
| 5.5 | 0 | — | 0 | — | — | — | — | — | — | — | — | — | 95 |
| 6.0 | 0 | 0 | 0 | 29 | 85 | 87 | 94 | 93 | 100 | 89 | 89 | 63 | 100 |
| 6.5 | 0 | — | 0 | — | — | — | — | — | — | — | — | — | 95 |
| 7.0 | 0 | — | 0 | — | — | — | — | — | — | — | — | — | 100 |
| 8.0 | 0 | 0 | 0 | 7.3 | 22 | 58 | 62 | 46 | 56 | 77 | 59 | 26 | 79 |

EXAMPLE 10

This example serves to illustrate the wide range of MONOMER/METAL RATIO that can be utilized in embodiments of this invention.

Separate volumes of film-forming solution, with MONOMER/METAL RATIO as indicated in Table 7, were prepared by mixing the 10% PVC solution of Example 1 with THF dilutions of the 6% Pd solution of Example 1. Films were cast onto glass slides from each solution under nitrogen environments of 0, 10 and 60% RH, activated by heat (180° for 5 min.) and immersed in a Copper Bath. Percent plating, determined as in Example 9, is reported in Table 7.

Figure 3:
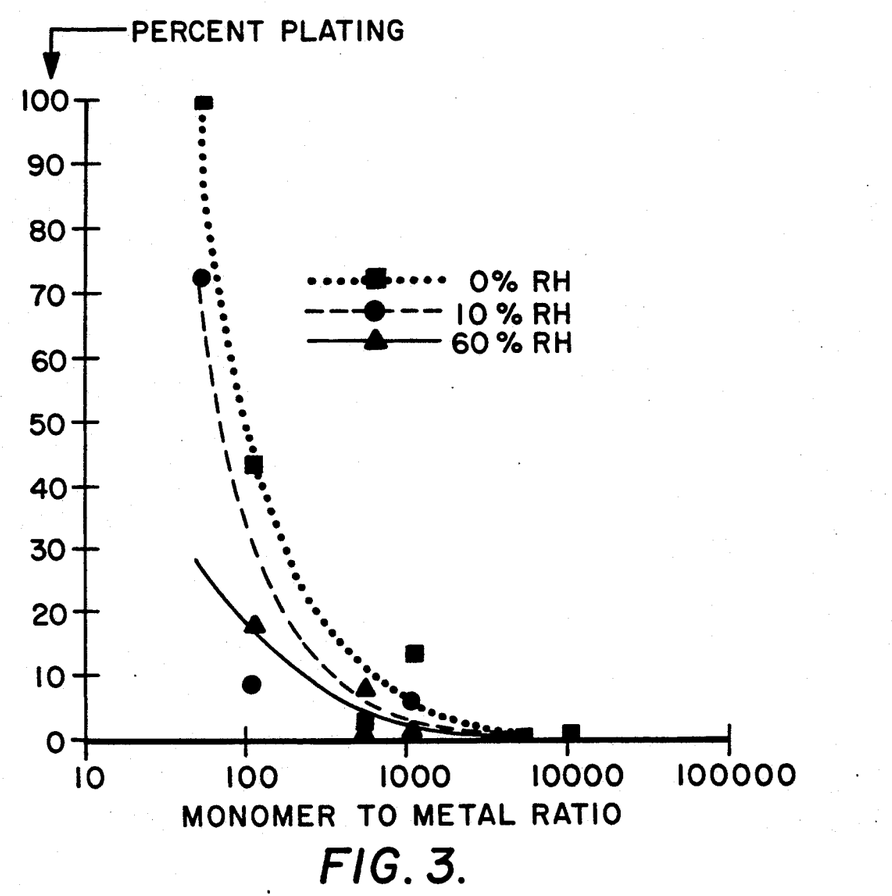
FIG. 3 illustrates the effect of metal concentration in several embodiments of the invention.

A semi-log plot of the results, FIG. 3, indicates that plating can be achieved at MONOMER/METAL RATIOS of less than about 5400 to 1.

TABLE 7

COPPER COATING OF PVC FILMS
PERCENT OF FILM AREA COATED

| MONOMER METAL | FILM FORMING ENVIRONMENT, % RH IN NITROGEN | | |
|---|---|---|---|
| | 0 | 10 | 60 |
| 54 | 100 | 72 | — |
| 108 | 43 | 8.3 | 18 |
| 540 | 2 | 0 | 7.8 |
| 1080 | 13 | 5.1 | 1.5 |
| 5400 | 0 | 0 | 0 |

EXAMPLE 11

This example serves to illustrate the significance of MONOMER/METAL RATIO in distinguishing activatable films of polymer complexed with CATALYTIC METAL from films that are not activatable.

10% PVC solution and 6% Pd solution, prepared essentially as Example 1, were combined to provide four film forming solutions having MONOMER/METAL RATIOS of 15 to 1, 20 to 1, 25 to 1 and 30 to 1. Each solution was used to prepare films in nitrogen environments at low humidity (about 10% RH). For each solution, films were either (a) not activated, (b) activated by light (U.V. for 2½ hours), or (c) activated by heat (180° for 5 minutes) prior to immersion in a Copper Bath.

A visual estimate of percent plating (based on film area) shown in Table 8 indicates that for films of complexes of PVC and palladium, a MONOMER/METAL RATIO of greater than about 15 to 1 is required for activatable films.

TABLE 8

PERCENT PLATING OF ELECTROLESSLY-DEPOSITED COPPER

| Activation | Time in Bath | MONOMER/METAL RATIO | | | |
|---|---|---|---|---|---|
| | | 15:1 | 20:1 | 25:1 | 30:1 |
| None | 2 min. | 100 | <2 | 0 | 0 |
| U.V. | 2 min. | 100 | 90 | 0 | 5 |
| Heat | ½ min. | 100 | 100 | 100 | 100 |

EXAMPLE 12

The example serves to illustrate embodiments of the following aspects of this invention: the preparation of film-forming solutions of polybutadiene and a CATALYTIC METAL compound, the preparation of activatable films from such solutions, the activation of such films, and the electroless deposition of copper onto such activated films.

5 g of polybutadiene rubber (Diene 55 TM by Firestone, Mw: 240,000; Mn: 105,000) was broken into small particles and dissolved in 70 g of THF to provide a 6.7% polybutadiene solution.

The polybutadiene solution was mixed with a 6% Pd solution (prepared essentially as in Example 1) in various proportions to provide solutions of each of the MONOMER/METAL RATIOS indicated in Table 9. Each of the solutions was cast into thin films on glass slides in nitrogen environments at room temperature both at high humidity (about 60-80% RH) and at low humidity (about 10% RH).

As indicated in Table 9 films prepared from each solution at each of the film-forming conditions were either (a) not activated, (b) activated by heat (180° for 5 minutes), (c) activated by light (U.V. for 2½ hours as indicated in Example 1), or (d) activated by light (U.V. for about 24 hours), prior to immersion in a Copper Bath for about 2 minutes.

A visual estimate of percent plating (based on film area) shown in Table 9 indicates that for films of complexes of polybutadiene and palladium, a MONOMER/METAL RATIO of at least about 35 to 1 (in some cases at least about 40 to 1 or higher, say about 50 to 1) is required for activatable films.

TABLE 9

PERCENT PLATING OF ELECTROLESSLY-DEPOSITED COPPER

| Activation | Monomer/Metal Ratio | | | | | | |
|---|---|---|---|---|---|---|---|
| | 20:1 | 25:1 | 30:1 | 35:1 | 40:1 | 45:1 | 50:1 |
| (a) Film formed at high humidity (62–80% RH) | | | | | | | |
| None | 100 | 100 | 95 | 80 | 30 | 20 | 10 |
| U.V. (2½ hours) | 100 | 100 | 100 | 100 | 100 | 100 | 100 |
| Heat | 100 | 100 | 95 | 25 | 30 | 0 | 0 |
| (b) Film formed at low humidity (about 10% RH) | | | | | | | |
| None | 100 | 75 | 60 | 30 | <1 | 0 | 5 |
| U.V. (2½ hours) | 100 | 100 | 100 | 85 | 60 | <5 | 25 |
| U.V. (24 hours) | 100 | 100 | 100 | 100 | 100 | 100 | 90 |

EXAMPLE 13

This example serves to illustrate embodiments of the following aspects of this invention: the preparation of film-forming solutions of polychloroprene and a CATALYTIC METAL compound, the preparation of activatable films from such solutions, the activation of such films and the electroless deposition of copper onto such activated films.

5 g of polychloroprene rubber (from Aldrich Chemical Company, 10% cis isomer) was broken into small particles and dissolved in 65 g of THF to provide a 7.1% polychloroprene solution.

1 part of a 6% Pd solution, prepared essentially as in Example 1, was added to 20 parts of the 7.1% polychloroprene solution to provide a film-forming solution having a MONOMER/METAL RATIO of about 28 to 1.

As indicated in Table 10 films were cast on glass slides in nitrogen environments at room temperature both at a low humidity (about 8% RH) and at a high humidity (about 60% RH); such films were either (a) not activated, (b) activated by heat (180° for 5 minutes) or (c) activated by U.V. light (about 10 hours), prior to immersion in a Copper Bath.

A visual estimate of percent plating (based on film area) shown in Table 10 indicates that such films of complexes of polychloroprene and palladium are activatable.

TABLE 10

PERCENT PLATING OF ELECTROLESSLY-DEPOSITED COPPER

| | Film-Forming Environment, Nitrogen | |
|---|---|---|
| Activation | 8% RH | 60% RH |
| None | <2 | 0 |
| Heat | 0 | 0 |
| U.V. | 90 | 95 |

While specific embodiments of the invention have been described, it should be apparent to those skilled in the art that various modifications thereof can be made without departing from the true spirit and scope of the invention. Accordingly, it is intended that the following claims cover all such modifications within the full inventive concept.

What is claimed is:

1. A solution for forming a film activatable to electroless deposition comprising
   (a) a compound of a Group 1B or Group 8 metal,
   (b) a polymer selected from the group consisting of polybutadiene, polychloroprene, and a polyvinyl halide wherein the polymer and metal are present in a molar ratio of monomer units to metal of less than 6000:1 and at least about 35 to 1 for polybutadiene, at least about 28 to 1 for polychloroprene and greater than about 20 to 1 for polyvinyl halide;
   (c) an organic solvent containing less than 8 percent water;
   (d) a soluble chloride salt for providing solubilizing anions for said compound;
   wherein films formed from said solution are catalytically inert and the concentration of metal is less than 0.1 atom percent of said metal at the film surface and higher in the interior of said film and said film is activatable to electroless deposition by exposure for up to 24 hours to UV radiation at about 7.5 milliwatt/square centimeter from a 254 nanometer wavelength mercury arc lamp at about 25 millimeters from said film surface or by exposure to heat in a 180° C. oven for up to 5 minutes.

2. A solution of claim 1 wherein said metal is palladium.

3. A solution of claim 2 wherein said organic solvent is substantially anhydrous and comprises tetrahydrofuran, methylene chloride, cyclohexanone or mixtures thereof.

4. A solution of claim 2 wherein said soluble chloride salt comprises lithium chloride.

5. A method for preparing catalytically inert, activatable films comprising:
   a. applying to a surface a solution comprising a polymer and at least one compound of a Group 1B or Group 8 metal wherein the molar ratio of monomer units of said polymer to atoms of said metal is between 6000:1 to about 20 to 1, thereby providing a film-forming coating;

b. drying said coating to provide a catalytically inert, activatable film comprising a complex of said polymer with said compound of a Group 1B or Group 8 metal, wherein the concentration of metal is less than 0.1 atom percent of said metal at the film surface and higher in the interior of said film and said film is activatable to electroless deposition by exposure for up to 24 hours to UV radiation at about 7.5 milliwatt/square centimeter from a 254 nanometer wavelength mercury arc lamp at about 25 millimeters from said film surface or by exposure to heat in a 180° C. oven for up to 5 minutes.

6. A method of claim 5 wherein said metal comprises palladium, platinum, iridium, rhodium, ruthenium or gold.

7. A method of claim 6 wherein said medium is substantially anhydrous.

8. A method of claim 7 wherein said applying and evaporating are conducted in a substantially anhydrous environment.

9. A method of claim 7 wherein said applying and evaporating are conducted in an environment having a relative humidity between about 30 and 80 percent.

10. A method of claim 6 wherein said polymer is a saturated and halogenated polymer, an unsaturated polymer or a vinyl polymer.

11. A method of claim 10 wherein said polymer is polyvinyl chloride and said metal is palladium.

12. A method of claim 6 further comprising delaminating the bulk of said film from said surface to provide a surface having an activatable residual layer of polymer complexed with said metal.

13. A method of claim 12 wherein said polymer is a saturated and halogenated polymer, an unsaturated polymer or a vinyl polymer.

14. A method of claim 13 wherein said polymer is polyvinyl chloride and said metal is palladium.

15. A method of providing an article that is activated to electroless deposition comprising:
a. applying to the surface of a mold a wet film comprising a solution of polymer and at least one compound of a Group 1B or Group 8 metal wherein the molar ratio of monomer units of said polymer to atoms of said metal is between about 6000 to 1 and about 20 to 1;
b. drying said wet film to provide a stable catalytically inert, activatable film comprising a complex of said polymer with said compound of a Group 1B or Group 8 metal, wherein the concentration of metal is less than 0.1 atom percent of said metal at the film surface and higher in the interior of said film and said film is activatable to electroless deposition by exposure for up to 24 hours to UV radiation at about 7.5 milliwatt/square centimeter from a 254 nanometer wavelength mercury arc lamp at about 25 millimeters from said film surface or by exposure to heat in a 180° C. oven for up to 5 minutes;
c. contacting said film with a molten thermoplastic material, having a temperature sufficient to activate said film; and
d. solidifying said thermoplastic material to provide a laminate of solid thermoplastic material and said film having a catalytically active surface.

16. A method of claim 15 wherein said polymer is a saturated and halogenated polymer, an unsaturated polymer or a vinyl polymer.

17. A method of claim 16 wherein said polymer is polyvinyl chloride and said metal is palladium.

18. A method of claim 15 further comprising separating said laminate from said surface, wherein said surface is catalytically active to the electroless deposition of metals from solutions.

19. A method of claim 18 wherein said polymer is a saturated and halogenated polymer, an unsaturated polymer or a vinyl polymer.

20. A method of claim 19 wherein said polymer is polyvinyl chloride and said metal is palladium.

21. A method of providing electrolessly deposited metal onto selected areas of a surface comprising:
a. applying to a substrate a film-forming solution of a polymer and at least one compound of a Group 1B or Group 8 metal, wherein the molar ratio of monomer units of said polymer to atoms of said Group 1B or Group 8 metal is between about 6000 to 1 and about 20 to 1;
b. solidifying said solution to provide a catalytically inert, activatable film comprising a complex of said polymer with said compound of a Group 1B or Group 8 metal, wherein the concentration of metal is less than 0.1 atom percent of said metal at the film surface and higher in the interior of said film and said film is activatable to electroless deposition by exposure for up to 24 hours to UV radiation at about 7.5 milliwatt/square centimeter from a 254 nanometer wavelength mercury arc lamp at about 25 millimeters from said film surface or by exposure to heat in a 180° C. oven for up to 5 minutes;
c. applying radiant energy or heat to selected areas of said film to activate said areas; and
d. contacting said film with an electroless plating solution to deposit reduced metal on said areas.

22. A method of claim 21 wherein said polymer is a saturated and halogenated polymer, an unsaturated polymer or a vinyl polymer.

23. A method of claim 22 wherein said polymer is polyvinyl chloride and said metal is palladium.

* * * * *